US009239893B2

(12) United States Patent
Curatolo et al.

(10) Patent No.: US 9,239,893 B2
(45) Date of Patent: Jan. 19, 2016

(54) METHOD AND PROCESS COMPUTER FOR COMPUTATION OF THE STATE VARIABLES OF A HYBRID DIFFERENTIAL-ALGEBRAIC PROCESS MODEL

(75) Inventors: Daniel Curatolo, Oberhausen (DE);
Marcus Hoffmann, Oberhausen (DE);
Benno Stein, Paderborn (DE)

(73) Assignee: Art Systems Software GmbH, Paderborn (DE)

( * ) Notice: Subject to any disclaimer, the term of this patent is extended or adjusted under 35 U.S.C. 154(b) by 62 days.

(21) Appl. No.: 13/497,677

(22) PCT Filed: Oct. 6, 2010

(86) PCT No.: PCT/EP2010/006095
§ 371 (c)(1),
(2), (4) Date: May 24, 2012

(87) PCT Pub. No.: WO2012/045322
PCT Pub. Date: Apr. 12, 2012

(65) Prior Publication Data
US 2013/0185031 A1  Jul. 18, 2013

(51) Int. Cl.
*G06F 17/10* (2006.01)
*G06F 17/50* (2006.01)

(52) U.S. Cl.
CPC ................. *G06F 17/5009* (2013.01)

(58) Field of Classification Search
CPC .......................... G05B 17/00; G06F 17/5009
USPC ........................................................... 703/2
See application file for complete search history.

(56) References Cited

U.S. PATENT DOCUMENTS 6,370,687 B1 *  4/2002  Shimura ....................... 717/146
6,937,966 B1 *  8/2005  Hellerstein et al. ............. 703/2
(Continued)

OTHER PUBLICATIONS

Wolfgang Kleissel et al., "A Qualitative Model for Hybrid Control," 2005, Proceedings of the 19th International Workshop on Qualitative Reasoning, http://www.qrg.northwestern.edu/papers/Files/qr-workshops/QR05/p26.pdf, eight pages.*
(Continued)

*Primary Examiner* — Aniss Chad
*Assistant Examiner* — Russ Guill
(74) *Attorney, Agent, or Firm* — Roberts Mlotkowski Safran & Cole, PC; David S. Safran (57) ABSTRACT

A method for computation of the state variables of a hybrid differential-algebraic process model in succeeding time steps on a process computer with a process interface, the process computer being set up such that, via the process interface, at least one process variable of a physical process can be detected by the process computer and/or one output for influencing the physical process can be output by the process computer. In a computation process, a current mode of the hybrid DAP is determined by evaluating the state variables for a deviation of the current mode of the hybrid DAP from the mode of the hybrid DAP applying beforehand, a mode-specific process model which corresponds to the current mode being chosen from the group of executable mode-specific process models and further computation is based on it. At least one probable future mode of the hybrid DAP is determined in a prediction process.

10 Claims, 4 Drawing Sheets

(56) References Cited

U.S. PATENT DOCUMENTS

| | | | |
|---|---|---|---|
| 8,352,229 B1* | 1/2013 | Ma et al. | 703/13 |
| 2012/0173004 A1* | 7/2012 | Radl | 700/29 |

OTHER PUBLICATIONS

Michael W. Hofbaur et al., "Hybrid Estimation of Complex Systems," 2004, IEEE Transactions on Systems, Man, and Cybernetics, vol. 34, No. 5, pp. 2178-2191.*

Hakan Lundvall et al., "Automatic parallelization of mathematical models solved with inlined runge-kutta solvers," 2007, EuroPVM/MPI 2007, LNCS 4757, Springer-Verlag, pp. 365-372.*

Rudiger Franke et al., "Online application of Modelica models in the industrial IT extended automation system 800xA," 2006, Proceedings of the 5th International Modelica Conference, pp. 293-302.*

Carla Martin et al., "Interactive simulation of object-oriented hybrid models, by combined use of EJS, Matlab/Simulink and Modelica/Dymola," 2004, Proceedings of the 18th European Simulation Multiconference, six pages.*

Peter Hamann et al., "Numerical solution of hybrid systems of differential-algebraic equations," 2008, Computer Methods in Applied Mechanics and Engineering, vol. 197, pp. 693-705.*

X. Rong Li et al., "Multiple-Model Estimation with Variable Structure Part V: Likely-Model Set Algorithm," 2000, IEEE Transactions on Aerospace and Electronic Systems, vol. 36, No. 2, pp. 448-466.*

Lars Blackmore et al., "Active estimation for markov jump linear systems," IEEE Transactions on Automatic Control, vol. 53, No. 10, pp. 2223-2236.*

X. Rong Li et al., "Multiple-Model Estimation with Variable Structure Part III: Model-Group Switching Algorithm," 2000, IEEE Transactions on Aerospace and Electronic Systems, vol. 35, No. 1, pp. 225-241.*

Alireza Karimi et al., "Robust adaptive control of a flexible transmission system using multiple models," 2000, IEEE Transaction on Control Systems Technology, vol. 8, No. 2, p. 321-331.*

George Almasi et al., "MaJIC: Compiling MATLAB for Speed and Responsiveness," 2002, Proceedings of the ACM SIGPLAN 2002 Conference on Programming language design and implementation, pp. 294-303.*

Michael W. Hofbaur et al., "Mode estimation of probabilistic hybrid systems," 2002, Proceedings of Hybrid Systems: Computation and Control 2002, pp. 253-266.*

Benjamin Podgursky et al., "Efficient tracking of behavior in complex hybrid systems via hybrid bond graphs,", 2010, Annual Conference of the Prognostics and Health Management Society, pp. 1-13.*

Simone Campanoni et al., "Dynamic Look Ahead Compilation: A Technique to hide JIT Compilation Latencies in Multicore Environment," 2009, 18th International Conference, Compiler Construction 2009, LNCS 5501, Springer-Verlag, pp. 220-235.*

Chandra J. Krintz et al., "Reducing the overhead of dynamic compilation," 2001, Software Practice and Experience, vol. 31, pp. 717-738.*

Brian C. Williams et al. "A model-based approach to reactive self-configuring systems," 1996, Proceedings AAAI 1996, pp. 971-978.*

David Padua, "Challenges in Compiling for Scientific Computing," 2000, US/Venezuela Workshop on High Performance Computing 2000, 84 pages.*

George Giorgidze et al., "Higher-order non-causal modelling and simulation of structurally dynamic systems," 2009, Proceedings of 7th Modelica Conference, 11 pages.*

* cited by examiner

METHOD AND PROCESS COMPUTER FOR COMPUTATION OF THE STATE VARIABLES OF A HYBRID DIFFERENTIAL-ALGEBRAIC PROCESS MODEL

BACKGROUND OF THE INVENTION

1. Field of the Invention

The invention relates to a method for computation of the state variables of a hybrid differential-algebraic process model (hybrid DAP=hDAP) in succeeding time steps on a process computer with a process interface, the process computer being set up such that, via the process interface, at least one process variable of a physical process can be detected by the process computer and/or an output for influencing the physical process can be output, and in a computation process a current mode of the hybrid DAP is determined by evaluating the state variables, for deviation of the current mode of the hybrid DAP from the mode of the hybrid DAP which applies beforehand an executable mode-specific process model which corresponds to the current mode is chosen from the group of executable mode-specific process models and the further computation is based on it. The invention furthermore relates to a process computer with a process interface for coupling of the process computer to a physical process, with the process computer at least one process variable of a physical process being detectable via the process interface and/or one output being able to be output for influencing the physical process.

2. Description of Related Art

Process computers and methods of the above described type which are to be executed on process computers are quite generally used in technical problem formulations to specifically observe a physical process and/or to specifically influence this physical process in order to influence it in the desired manner. Often, process models—therefore functional physical-technical relationships which can be described by mathematical equations—are implemented on these process computers and for example, for control purposes constitute a mathematical model of the linked physical process, or mathematically simulate a process which is different from the linked physical process and which simulates a part of reality for example, for excitation of the "real" physical process, as is known for example, of simulators. These process computers, especially from the domain of control device development (rapid control prototyping, hardware-in-the-loop tests), can no longer be dispensed with.

Depending on the type of process which is to be computed and modeled on the process computer, the process model has different mathematical properties. Many process models consist of a system of linear or nonlinear differential equations, in the simplest case of a single differential equation. These differential equations are solved with the known numerical methods. Since the process computer is conventionally joined to a real physical process, it is necessary to compute the process model in real time so that process variables of the physical process can be detected and further processed in the desired time reference—defined by the succeeding time steps on the process computer—, and outputs for influencing the physical process can be output from the process computer.

Many process models, in addition to differential equations or systems of differential equations, also comprise algebraic equations which typically describe the behavior of conservation variables in the process. Simple relationships of this type are for example, currents in nodes of an electrical network, the energy constancy in a closed system, the volumetric flow of an incompressible medium, the conservation of momentum in a multibody system and other secondary kinetic conditions. These models are called differential-algebraic process models, hereinafter abbreviated "DAP".

DAP are often structurally-invariant, i.e., they fix the state variables of the process model and the relationships between the state variables a priori, the mathematical framework as such does not change, neither over time nor depending on other conditions. These systems can be transferred into a complete algorithmic model—for example, in the form of C-code—due to their structural invariance before the run time of the computation, and before the start of computation the structurally-invariant models can be optimized with the known mathematical methods for minimizing computation effort, therefore for example, by BLT transforms, tearing or sparse-matrix methods. From the run time-optimized algorithmic model then a process model which can be executed on the process computer can be prepared, therefore, for example, by completion of the above cited C-code.

More complex process models are, however, often structurally variant, they have different modes which are characterized in that, for example, different combinations of state variables or different relationships between a choice of state variables which remains the same describe the functionality of the process model, these different modes of the process model being activated or deactivated depending on certain conditions. A structurally variant differential-algebraic model is called a hybrid DAP. When the conditions are bivalent, a hybrid DAP with n conditions has a total of $2^n$ possible modes. Depending on the state variables of the process model, therefore different parts of the hybrid DAP are activated or deactivated so that a special mode of the hybrid DAP is less complex (in the sense of comprehensive) than the hybrid DAP which is omnipotent and encompasses all possible modes.

Hybrid DAPs are transferred into an executable, mode-aspecific process model which then altogether underlies the computation process with all the conditions which occur in them, which are linked to the state variables, and which lead to different modes of the hybrid DAP. The complexity of this hybrid DAP alone entails major difficulties due to the in part considerable size of these process models, especially difficulties with respect to real time computation capacity. In addition, hybrid DAPs cannot be well optimized mathematically due to the case differences contained in them; this is likewise disadvantageous for the run time behavior.

In order to be able to carry out the computation process, in each time step based on a more slender, mode-specific process model, it is conceivable to extract from the hybrid DAP all possible mode-specific DAPs, each of these mode-specific DAPs being stripped of case differences and thus all parts of the hybrid DAP which are not needed, as a result of which each mode-specific DAP can be optimized with known mathematical methods and can be transferred into a "fast", executable mode-specific process model. The totality of all possible executable mode-specific process models can then be supplied to a group of executable mode-specific process models. This procedure is problematic in practice since the group of executable mode-specific process models can be extremely large ($2^n$ executable mode-specific process models for n binary case differences) and entails a considerable memory demand and moreover the preprocessing of the hybrid DAP can be very tedious. Often, this also applies when prior to real time execution the modes which actually occur are known and not all possible executable mode-specific process models, but only certain executable mode-specific process models, need be generated and extracted.

In one computation process, by evaluating the state variables a current mode of the hybrid DAP is then determined, in deviation of the current mode of the hybrid DAP from the mode of the hybrid DAP which applies beforehand, an executable mode-specific process model which corresponds to the current mode is selected from the group of executable mode-specific process models and further computation is based on it.

SUMMARY OF THE INVENTION

Therefore, the object of this invention is to provide a method for computation of the state variables of a hybrid DAP with which a prompt computation of the different modes of the hybrid DAP is possible for a memory load on the process computer which has been reduced if possible.

The derived and described object in the above explained method for computation of the state variables of a hybrid differential-algebraic process model is achieved in that, for the run time of the computation in a prediction process, at least one probable future mode of the hybrid DAP is determined by evaluation of the state variables, from the hybrid DAP the mode-specific DAP which corresponds to the determined probable future mode is extracted, from the extracted mode-specific DAP an executable mode-specific process model is produced and supplied to the group of executable mode-specific process models.

In the aforementioned group of executable mode-specific process models, those mode-specific process models are provided whose future use seems probable based on current values of the state variables. The group can also contain only a single executable mode-specific process model, for example, when this mode-specific process model constitutes the solely possible future follow-up mode of the hybrid DAP or however the overwhelmingly probable follow-up mode of the hybrid DAP.

If for, example, it is assumed that a motor with the associated gear train is computed by a hybrid DAP on the process computer, it is conceivable that the different gear stages form different modes of the corresponding hybrid DAP. If it is, furthermore, assumed that a change of gear ordinarily takes place in one stage, reasonable assumptions for the gears used in the future and thus for the probably future modes of the hybrid DAP are the directly adjacent gear stages of the gear stage which is being currently used.

In the aforementioned prediction process, those considerations are considered which are always based on evaluation of the state variables of the process model. Then the mode-specific DAPs which correspond to the future modes which seem probable are extracted—possibly only a single mode-specific DAP is also extracted—from the encompassing hybrid DAP in which all case configurations are considered, an executable mode-specific process model being produced from each extracted mode-specific DAP, therefore code which can be executed on the process computer.

In an especially advantageous configuration of the method in accordance with the invention, it is provided that the prediction process is executed simultaneously with the computation process. This is preferably done with hardware by the computation process and the prediction process being executed on different computation units, especially specifically on different computation units of the process computer. These computation units can be, for example, different processors of the process computer or also different cores of the processor of the process computer; what is important is simply that, here, a genuine parallelism of the computation process and of the prediction process can be carried out.

Process models—no matter what type—are computed on process computers using numerical methods in succeeding time steps, and the computation can be carried out entirely in different time references—sampling frequencies. At the start of each time step, and thus, computation step, in any case, the current data underlying the computation, therefore values of the state variables, must be acquired which are either results of the time steps which have been computed beforehand or also which have been currently detected by the process via the process interface. The result of the computation process within this time step is then a new set of state variables which are optionally output for influencing the linked physical process via the process interface of the process computer and are also output as outputs.

Based on the newly determined, current state variables, it is then possible to decide whether there is possibly a mode change. In order to carry out the prediction process altogether on a standard data basis, therefore in one preferred configuration of the method, it is provided that the prediction process take place based on consistent state variables, therefore based on a set of state variables which originate from a common time step, therefore not based on a set of state variables which originate from different time steps. In particular, it can be provided here that the computation process is executed with a higher priority than the prediction process so that in any case in the time reference used there are current state variables even if the prediction process is deferred. This underlies the experience that generally a host of time steps and thus computation steps for the computation process is carried out within one mode of the hybrid DAP before a mode change occurs.

According to another preferred configuration of the method in accordance with the invention, the state variables are evaluated by extrapolation of the state variables within the prediction processes by, therefore, the historical development of the state variables being projected by corresponding mathematical extrapolation methods in the domain of future time steps of the computation process. This can take place for example, by linear extrapolation or also by polynomial extrapolation, and a different number of preceding values of the state variables can be used. In one especially advantageous version of the aforementioned method solely the mode-relevant state variables are used for extrapolation, therefore those state variables on which the conditions for switching of the different modes of the hybrid DAP depend.

In another especially advantageous configuration of the method in accordance with the invention, it is provided that those future modes of the hybrid DAP are classified as probable which are adjacent to the mode which applies beforehand. Here, those modes which occur as follow-up modes according to experience are considered adjacent, as had been explained initially on the example of the gears of a transmission, but in general those modes can also be considered adjacent which are achieved by the smallest possible changes of the state variables. This method is especially promising in those modes of the hybrid DAP which are influenced by externally determined state variables. This can be, for example, state variables which depend on an operator, and thus, are subject to the will of the operator, or also those state variables which are state variables of the physical process which has been linked via the process interface and which are received from the process computer via the process interface. In this respect, it is especially advantageous here when those modes as the mode which applies beforehand are regarded as adjacent, which are achieved by the smallest possible changes of the state variables which have been externally determined.

In another preferred configuration of the method which comprises the invention, it is provided that executable mode-specific process models which have been produced for probable future modes of the hybrid DAP are left in the group so that the group contains not only the fully currently determined probable future modes or the mode-specific process models which correspond to these modes, but also other executable mode-specific process models which correspond or corresponded to the historical future modes which have been determined to be probable. This version of the method takes into account the circumstance that the determination of probable future modes, but especially also the generation of executable mode-specific process models, entails a major computer cost which, as long as there is sufficient memory anyway on the process computer, can be reduced by the above described measure. This altogether increases the probability that the computation process and the prediction process both can be executed at the same time in real time so that the real time demands on the method can be satisfied with greater probability. It is especially advantageous if a maximum number of executable mode-specific process models in the group is always present, therefore provided.

In spite of continuously providing the group with selected executable mode-specific process models, it is theoretically possible that, by evaluating the state variables, a current mode of the hybrid DAP is determined for which the group does not contain any corresponding executable mode-specific process model which accordingly cannot underlie a further computation either. In this case, it is provided that, in the absence of the executable mode-specific process model which corresponds to the determined current mode of the hybrid DAP in the group, the mode-specific DAP corresponding to the determined probable future mode is extracted from the hybrid DAP, from the extracted mode-specific DAP, an executable mode-specific process model is produced and used, especially is also supplied to the group.

It can also be alternatively provided for this development of the method that, to compute the state variables in the time steps in which the corresponding executable mode-specific process model has not yet been extracted from the hybrid DAP, simply the executable process model which corresponds to the complete hybrid DAP is used to compute the state variables, even if this can take much longer than the computation of a executable mode-specific process model.

Finally, the aforementioned object is achieved in the initially described process computer with a process interface for coupling of the process computer to a physical process in that the process computer is made such that it can execute the method in accordance with the invention and the above described preferred developments of the method in accordance with the invention for computing the state variables of a hybrid differential-algebraic process model in succeeding time steps.

In particular there is now a plurality of possibilities for embodying and developing the method in accordance with the invention for computation of the state variables of a hybrid differential-algebraic process model. In this regard reference is made to the following description of exemplary embodiments in conjunction with the accompanying drawings.

DETAILED DESCRIPTION OF THE INVENTION

Figure 1:
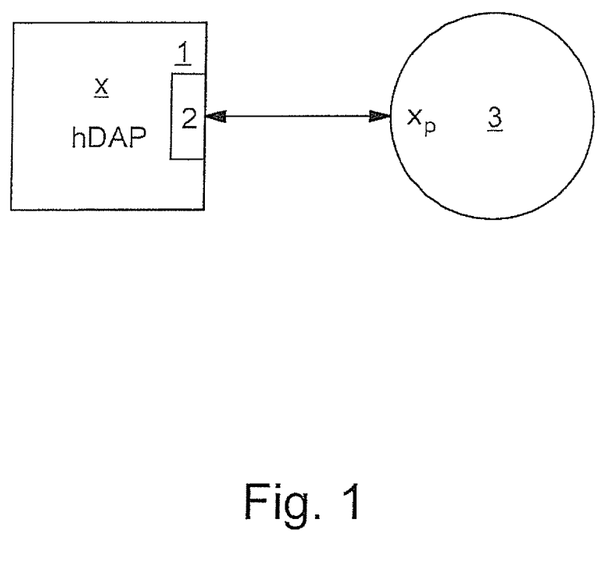
FIG. 1 shows the specific situation for use of the method in accordance with the invention with a process computer which is linked to a physical process via an interface.

FIG. 1 shows a process computer 1 with a process interface 2, the process computer 1 being set up such that, via the process interface 2, at least one process variable $x_p$ of a physical process 3 is detected by the process computer 1 and/or an output which is not expressly shown for influencing the physical process 3 can be output by the process computer 1. This is the typical hardware situation in which the method which is explained below in detail for computing the state variables $\underline{x}$ of a hybrid differential-algebraic process model hDAP is carried out in successive time steps.

The number of state variables $\underline{x}$ is composed of state variables which are used solely on the process computer for computing the hybrid differential-algebraic process model hDAP which for its part can also be partially output as outputs for influencing the physical process 3 by the process computer 1, and of those state variables $x_p$ which are process variables of the physical process 3, and accordingly, originate from the physical process 3 and are transmitted to the process computer 1 via the process interface 2.

The process computer 1 can be, for example, a control device in which a hybrid DAP hDAP is computed for implementing a complex control task. However, the process computer 1 can also be a simulator to which, via the process interface, a hardware component to be tested (Device Under Test, DUT), for example, a control device, is connected, the process computer 3 acting as the simulator m ore or less simulating the outside world of the linked physical process 3.

Since the physical process 3, of course, proceeds in real time, the computation of the hybrid DAPS hDAP on the process computer 1 must also take place in real time. This means that the numerical method which is ordinarily used on the process computer 1 for computing the hybrid DAP hDAP must be carried out in a sampling frequency which is defined by the succeeding time steps. Typical sampling period durations are in the range of milliseconds and fractions thereof. In order to be able to meet the real time requirements, major efforts are made with respect to the mathematical conditioning and optimization of the hybrid DAP hDAP.

One possibility for mathematical treatment of the hybrid DAP on the process computer 1 involves leaving the conditions which comprise the hybridness of the DAP in the process model and generating an executable hybrid process model (hDAP$_{exe}$) from the hybrid DAP. This executable hybrid process model hDAP$_{exe}$ for computing the state variables is, on the one hand, all-encompassing, therefore contains any case configurations of the hybrid process model, but on the other hand, is also very extensive and computer-intensive.

Figure 2:
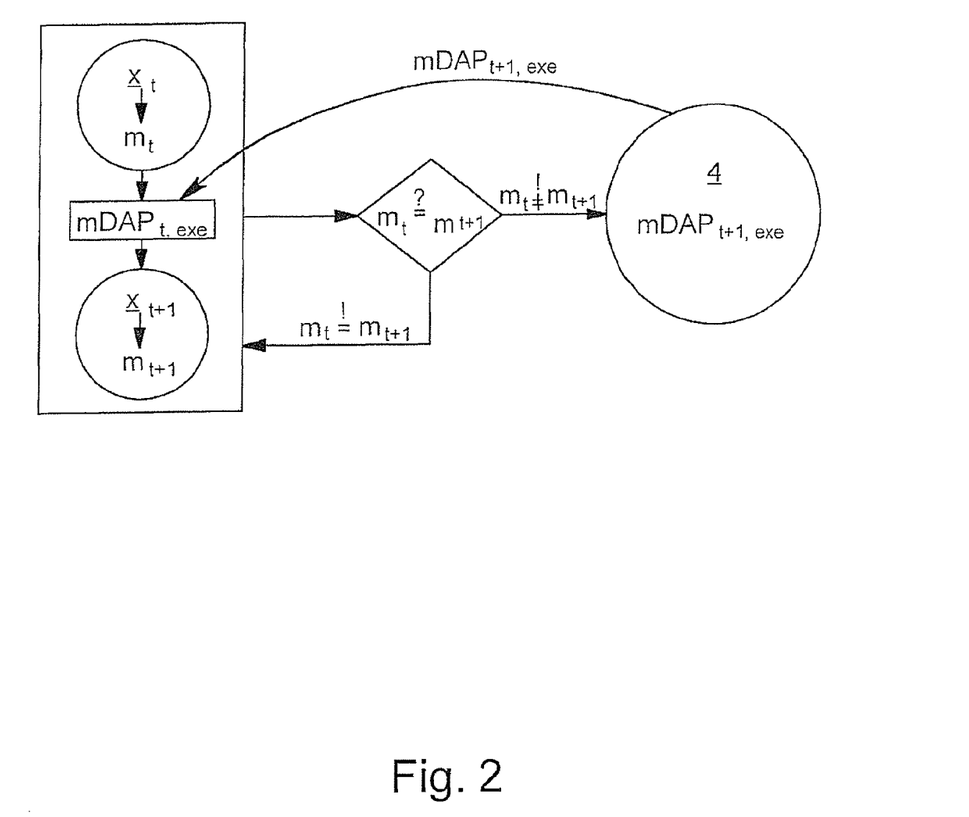
FIG. 2 shows a part of the method in accordance with the invention for computation of the state variables of a hybrid differential-algebraic process model, especially specifically the computation process.
Figure 3:
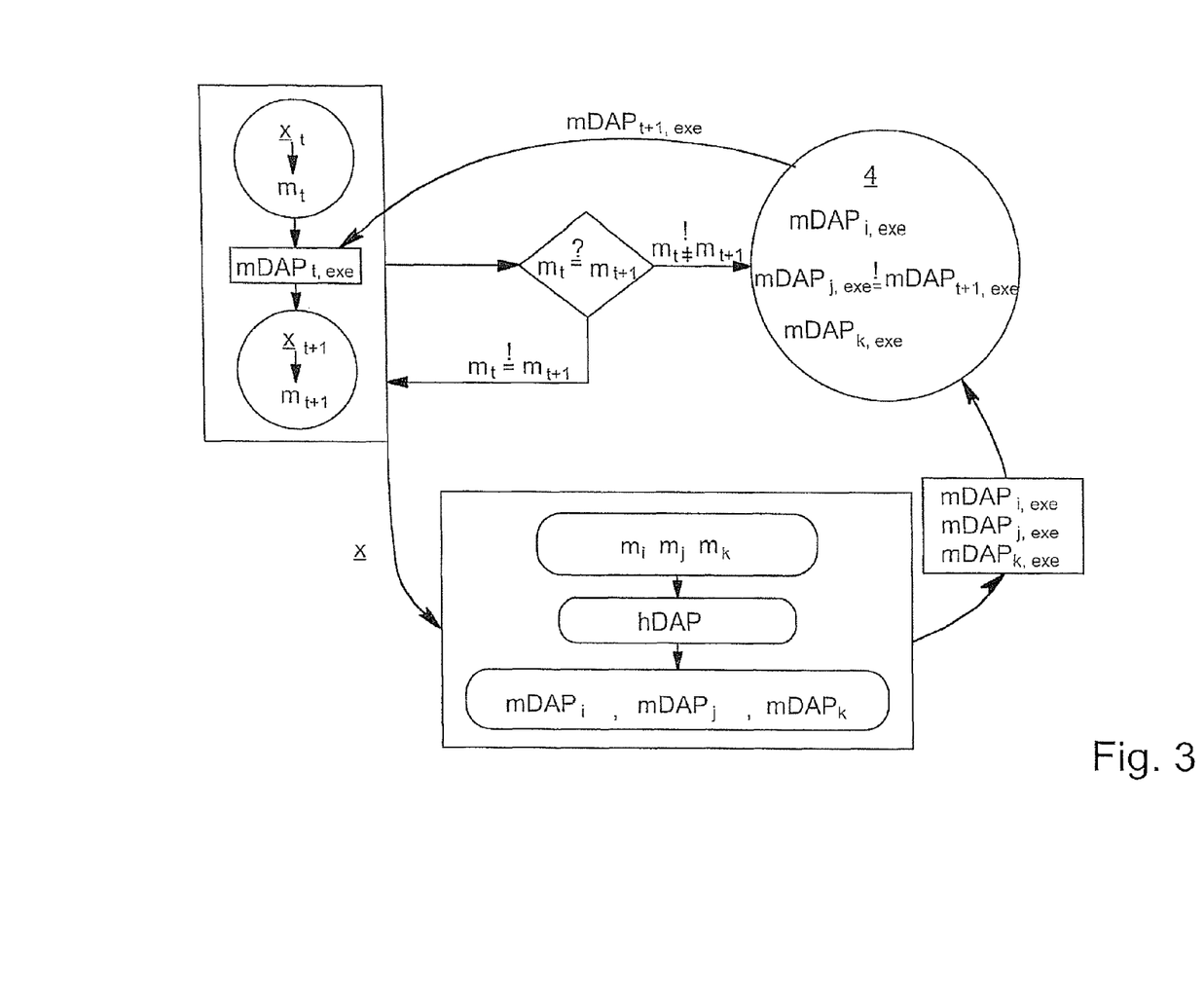
FIG. 3 shows the method according to FIG. 2, with the prediction process of the method in accordance with the invention added.
Figure 4:
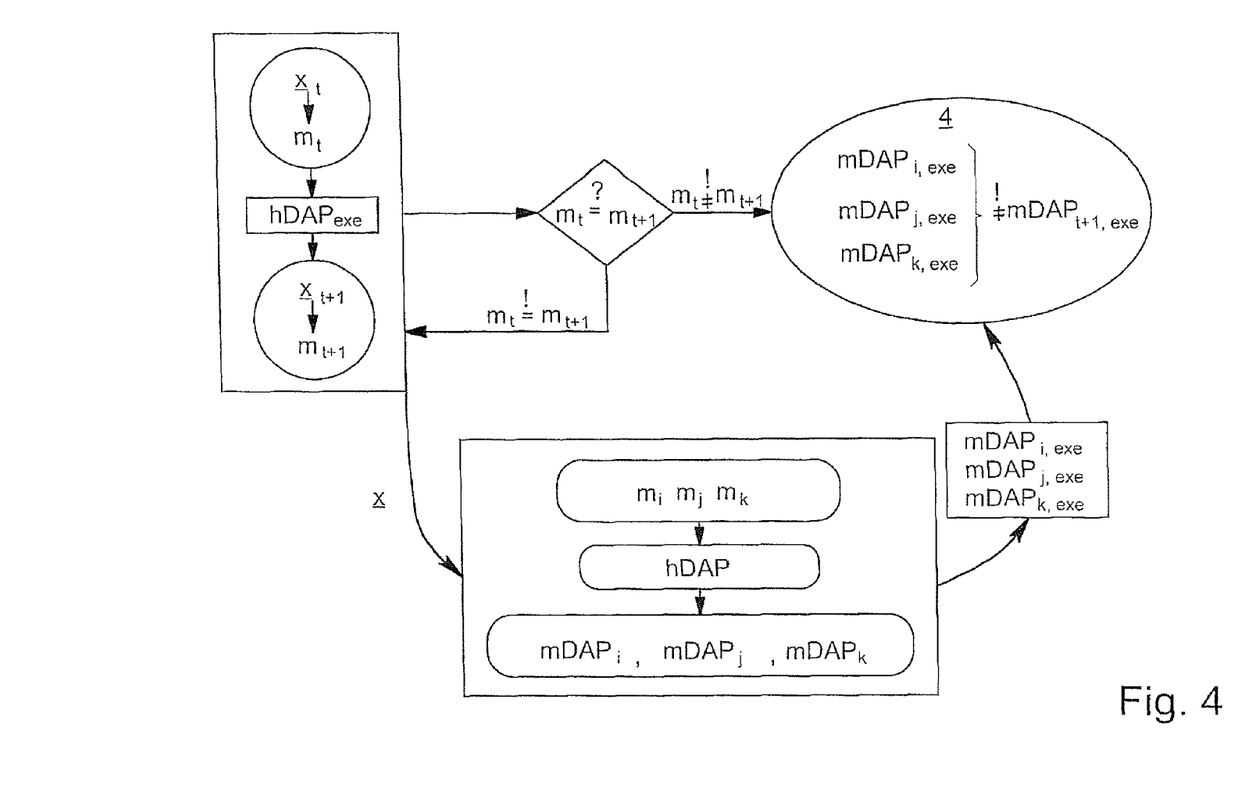
FIG. 4 shows a configuration of the method in accordance with the invention for the case in which the group does not have a required executable mode-specific process model.

For the aforementioned reason, in the method shown in FIGS. 2 to 4, it is provided that, for the run time of the computation in a computation process, a current mode $m_{t+1}$ of the hybrid DAP is determined by evaluating the state variables $\underline{x}$, for a deviation of the current mode $m_{t+1}$ of the hybrid DAP from the mode $m_1$ of the hybrid DAP which applies beforehand, an executable mode-specific process model $mDAP_{t+1,exe}$ which corresponds to the current mode $m_{t+1}$ is chosen from a group 4 of executable mode-specific process models $mDAP_{exe}$ and the further computation is based on it.

The computation process is therefore based on the idea that a complete executable hybrid process model $hDAP_{exe}$ is not used for computation of the state variables x, but rather an executable mode-specific process model $mDAP_{t+1,exe}$ which is tailored to the respective required mode and which is provided in group 4. This mode-specific process model, as an extract from the hybrid DAP hDAP, no longer contains any conditions which could cause structure variance of the system of equations. Accordingly, an executable mode-specific process model $mDAP_{t+1,exe}$ can be executed much more quickly than an executable overall process model $hDAP_{exe}$.

FIG. 2 shows that, in a time step of the computation, the current state variables $\underline{x}_{t+1}$ are computed from the state variables $\underline{x}_t$ which apply beforehand, the values of the state variables $\underline{x}_t$, $\underline{x}_{t+1}$ deciding about the mode $m_t$ which applies beforehand and the current mode $m_{t+1}$. The current state variables $\underline{x}_{t+1}$ are computed from the state variables $\underline{x}_t$ which apply beforehand with the aid of the executable mode-specific process models $mDAP_{t,exe}$ which belongs to the currently recognized mode.

After the computation step, it is checked whether the current mode $m_{t+1}$ of the hybrid DAP hDAP agrees with the previously determined mode $m_t$ of the hybrid DAP hDAP and for a deviation of the two modes, the executable mode-specific process model $mDAP_{t+1, exe}$ which corresponds to the new current mode $m_{t+1}$ is taken from group 4 and a further computation is based on it, which is indicated in FIG. 2 by the curved arrow between group 4 and the computation process.

Furthermore, the method explained here is also characterized by a prediction process which is shown in FIG. 3 to supplement the computation process from FIG. 2. In the prediction process, at least one probable future mode $m_i$, $m_j$, $m_k$ of the hybrid DAP is determined by evaluation of the state variables x, from the hybrid DAP hDAP the mode-specific DAP $mDAP_i$, $mDAP_j$, $mDAP_k$ which corresponds to the determined probable future mode $m_i$, $m_j$, $m_k$ is extracted, from the extracted mode-specific specific DAP $mDAP_i$, $mDAP_j$, $mDAP_k$ an executable mode-specific process model $mDAP_{i,exe}$, $mDAP_{j,exe}$, $mDAP_{k,exe}$ is produced and supplied to group 4.

If it is found that a mode change has taken place, therefore there is a difference between the mode $m_t$ which applies beforehand and the current mode $m_{t+1}$, according to the above described computation process, it is checked whether the executable mode-specific process model $mDAP_{t+1,exe}$ which corresponds to the current mode $m_{t+1}$ is present in group 4. It is apparent in FIG. 3 that, in fact, the required executable mode-specific process model $mDAP_{t+1, exe}$ is present in group 4, specifically in the form of the executable mode-specific process model $mDAP_{j,exe}$.

FIG. 3, likewise, shows that, within the framework of the prediction process, with knowledge of the probable future modes $m_k$ of the hybrid DAP hDAP, the corresponding mode-specific DAP $mDAP_i$, $mDAP_j$, $mDAP_k$ are extracted from the hybrid DAP hDAP; this means simply that the hybrid DAP hDAP is stripped of all the conditions which comprise the hybridness of the DAP, and only those parts of the process model are retained which are necessary for computation of the corresponding mode. Then, executable mode-specific process models $mDAP_{i,exe}$, $mDAP_{j,exe}$, $mDAP_{k,exe}$ are generated from the extracted mode-specific DAP $mDAP_i$, $mDAP_j$, $mDAP_k$ which are present, for example, in the form of C-code, here by compiling of the C-code.

It can happen that group 4 does not contain that executable mode-specific process model which is required for further computation. This situation is shown in FIG. 4 in which it is shown that none of the members of group 4, therefore the mode-specific process models $mDAP_{i,exe}$, $mDAP_{j,exe}$, $mDAP_{k,exe}$ which correspond to the probable future modes $m_i$, $m_j$, $m_k$, corresponds to the actually required executable mode-specific process model $mDAP_{i+1,exe}$. In this case, the alternative solution by way of exception is the executable hybrid process model $hDAP_{exe}$ for computation of the state variables x, which does entail the disadvantage of a slower computation, but guarantees that a computation takes place in the correct mode.

What is claimed is:

1. Method for computation of the state variables of a hybrid differential-algebraic process model (hybrid DAP) in succeeding time steps on a process computer with a process interface, comprising the steps of:
    A) setting up the process computer such that at least one process variable of a physical process can be at least one of:
        1) detected by the process computer via the process interface and
        2) output for influencing the physical process by the process computer via the process interface,
    B) determining a current mode of the hybrid DAP in a computation process by evaluating state variables for deviation of a current mode of the hybrid DAP from a prior mode of the hybrid DAP,
    C) choosing a mode-specific process model, which is less complex than the hybrid DAP by only activating a subset part of the hybrid DAP and which corresponds to the current mode from a group of executable mode-specific process models and basing a further computation on the chosen mode-specific process model, and
    D) for obtaining executable mode-specific process models for said group,
        1) using a prediction process for determining at least one probable future mode of the hybrid DAP by evaluating the state variables,
        2) extracting a mode-specific DAP which corresponds to the determined at least one probable future mode from the hybrid DAP,
        3) producing an executable mode-specific process model from the extracted mode-specific DAP and supplying executable mode-specific process model produced to the group of executable mode-specific process models, and
    E) to the extent necessary as determined by the computations of the preceding steps, using the process computer to influence the physical process via the process interface,
    wherein the hybrid DAP is a structurally variant, omnipotent and all-encompassing differential-algebraic model and therefore contains any case configurations of the hybrid process model.

2. Method as claimed in claim 1, wherein the prediction process of step D)1) is executed simultaneously with the computation process of step B).

3. Method as claimed in claim 2, wherein the computation process of step B) and the prediction process of step D)1) are carried out on different processors of the process computer.

4. Process according to claim 2, wherein the physical process influenced is changing of gears of a gear train associated with motor.

5. Method as claimed in claim 1, wherein the prediction process of step D)1) is performed based on consistent state variables, and the computation process is carried out with a higher priority than the prediction process.

6. Method as claimed in claim 1, wherein the state variables are evaluated within the prediction processes by extrapolation of the state variables.

7. Method as claimed in claim 1, wherein those future modes of the hybrid DAP which are achieved by the smallest possible change of the state variables are classified as probable.

8. Method as claimed in claim 1, wherein executable mode-specific process models which have been produced for determined probable future modes of the hybrid DAP are left in the group of executable mode-specific process models.

9. Method as claimed in claim 1, wherein, in step C), in the absence of a executable mode-specific process model which corresponds to the determined current mode of the hybrid DAP in the group, the mode-specific DAP corresponding to the determined probable future mode is extracted from the hybrid DAP, and wherein an executable mode-specific process model is produced from the extracted mode-specific DAP and is supplied to the group.

10. Method as claimed in claim 1, wherein, in step C), in the absence of an executable mode-specific process model which corresponds to the determined current mode of the hybrid DAP in the group, an executable hybrid differential-algebraic process model is used to compute the state variables, wherein the conditions which comprise the hybridness of the DAP are left in the process model and the executable hybrid process model is generated from the hybrid DAP.

* * * * *